United States Patent
Haiberger et al.

(10) Patent No.: US 11,473,221 B2
(45) Date of Patent: Oct. 18, 2022

(54) TEXTILE COMPONENT AND METHOD FOR PRODUCING A TEXTILE COMPONENT

(71) Applicant: OSRAM OLED GmbH, Regensburg (DE)

(72) Inventors: Luca Haiberger, Regensburg (DE); Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 104 days.

(21) Appl. No.: 16/766,442

(22) PCT Filed: Nov. 30, 2018

(86) PCT No.: PCT/EP2018/083188
§ 371 (c)(1),
(2) Date: May 22, 2020

(87) PCT Pub. No.: WO2019/115258
PCT Pub. Date: Jun. 20, 2019

(65) Prior Publication Data
US 2021/0025083 A1     Jan. 28, 2021

(30) Foreign Application Priority Data
Dec. 14, 2017   (DE) .......................... 102017129994.7

(51) Int. Cl.
*D02G 3/44*  (2006.01)
*D03D 1/00*  (2006.01)
(Continued)

(52) U.S. Cl.
CPC .......... *D02G 3/441* (2013.01); *D03D 1/0088* (2013.01); *D03D 15/00* (2013.01); *D03D 15/47* (2021.01);
(Continued)

(58) Field of Classification Search
None
See application file for complete search history.

(56) References Cited

U.S. PATENT DOCUMENTS

2004/0009729 A1    1/2004  Hill et al.

FOREIGN PATENT DOCUMENTS

| CN | 102384447 A | 3/2012 |
|---|---|---|
| DE | 10124457 A1 | 12/2002 |

(Continued)

OTHER PUBLICATIONS

Machine translation of JP2007314925 (Year: 2007).*
International Search Report for PCT/EP2018/083188 dated Apr. 26, 2019.

*Primary Examiner* — Shawn Mckinnon
(74) *Attorney, Agent, or Firm* — ArentFox Schiff LLP

(57) ABSTRACT

The invention relates to an embodiment in which the textile component comprises at least one flexible thread that can be woven. A plurality of semiconductor columns are attached in or on the thread and are configured to generate radiation. Furthermore, a plurality of electrical lines are located in or on the thread, by means of which lines the semiconductor columns are electrically contacted. An average height (H) of the semiconductor columns in a direction transverse to a longitudinal direction (L) of the thread is at most 20% of an average diameter (D) of the thread.

16 Claims, 10 Drawing Sheets

Figure 3:
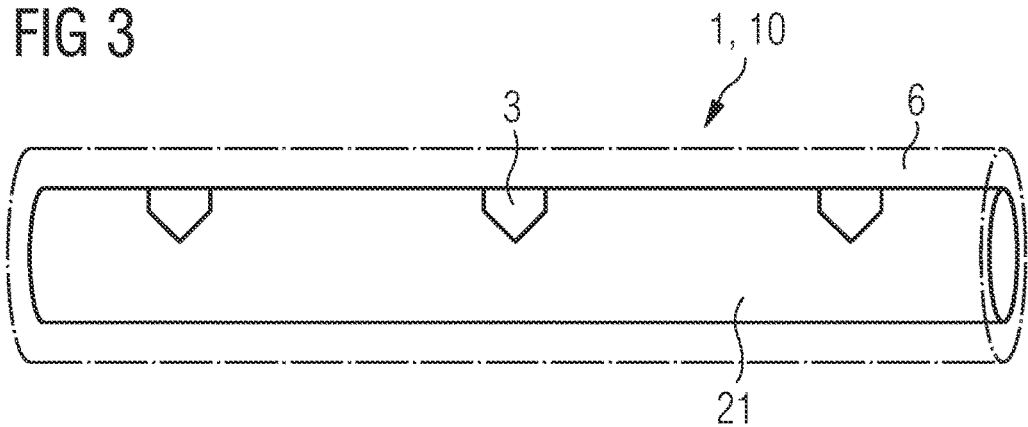

(51) Int. Cl.
*D03D 15/00* (2021.01)
*F21S 4/15* (2016.01)
*F21V 8/00* (2006.01)
*D03D 15/47* (2021.01)
*D03D 15/547* (2021.01)

(52) U.S. Cl.
CPC .............. *D03D 15/547* (2021.01); *F21S 4/15* (2016.01); *D10B 2401/16* (2013.01); *D10B 2401/18* (2013.01); *D10B 2401/20* (2013.01)

(56) References Cited

FOREIGN PATENT DOCUMENTS

| | | | |
|---|---|---|---|
| JP | 2007-314925 | A | 12/2007 |
| WO | 2011128825 | A | 10/2011 |
| WO | 2016087605 | A | 6/2016 |

\* cited by examiner

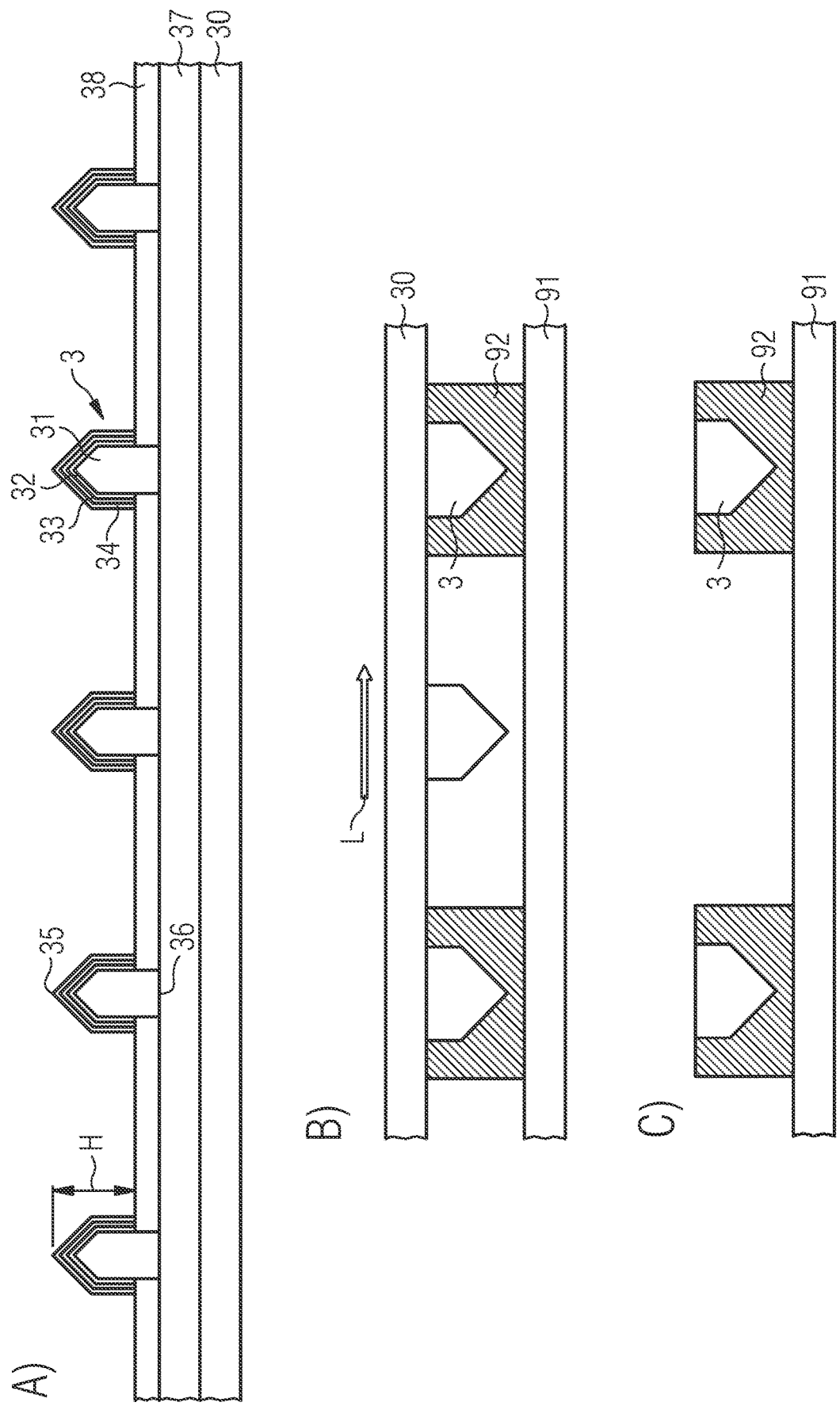

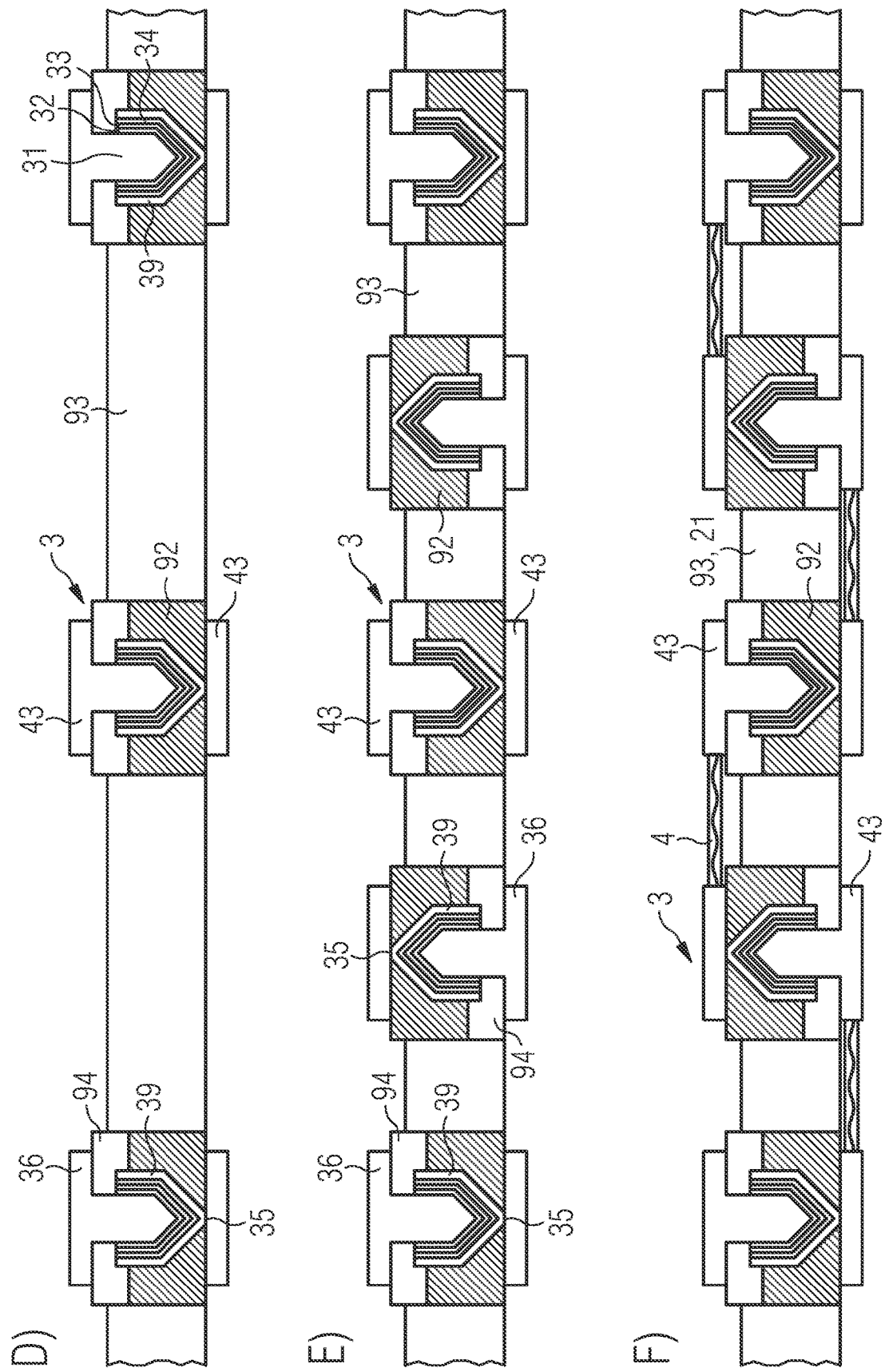

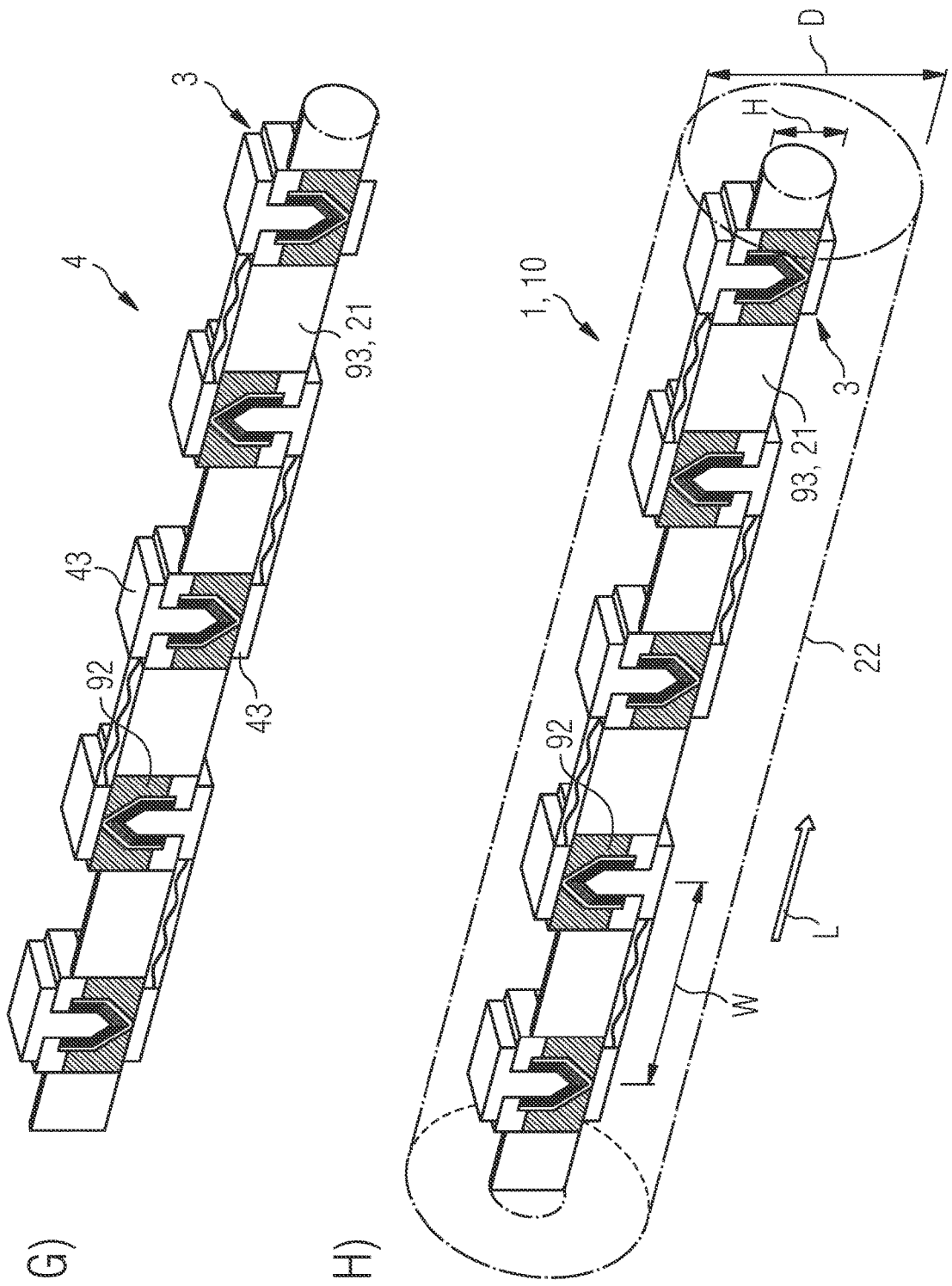

FIG 2
A)
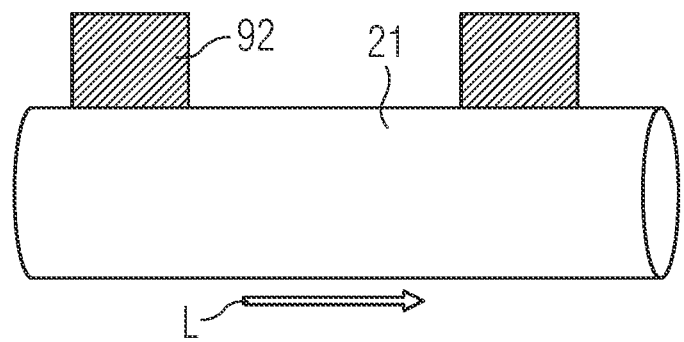
B)
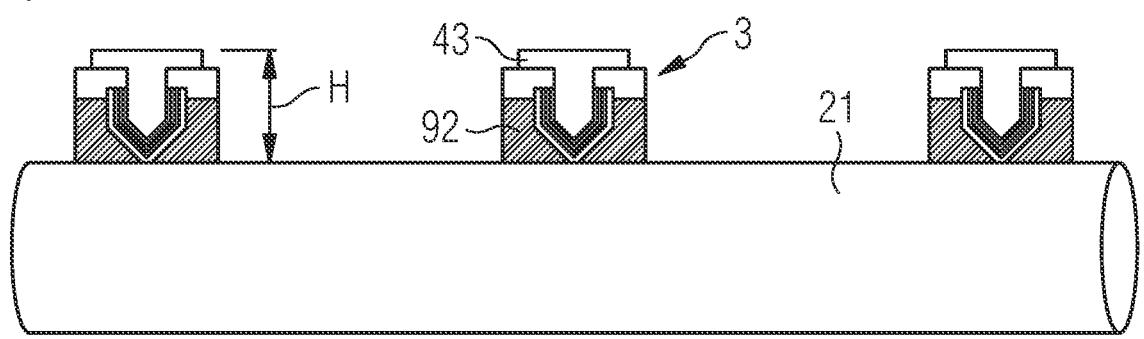
C)
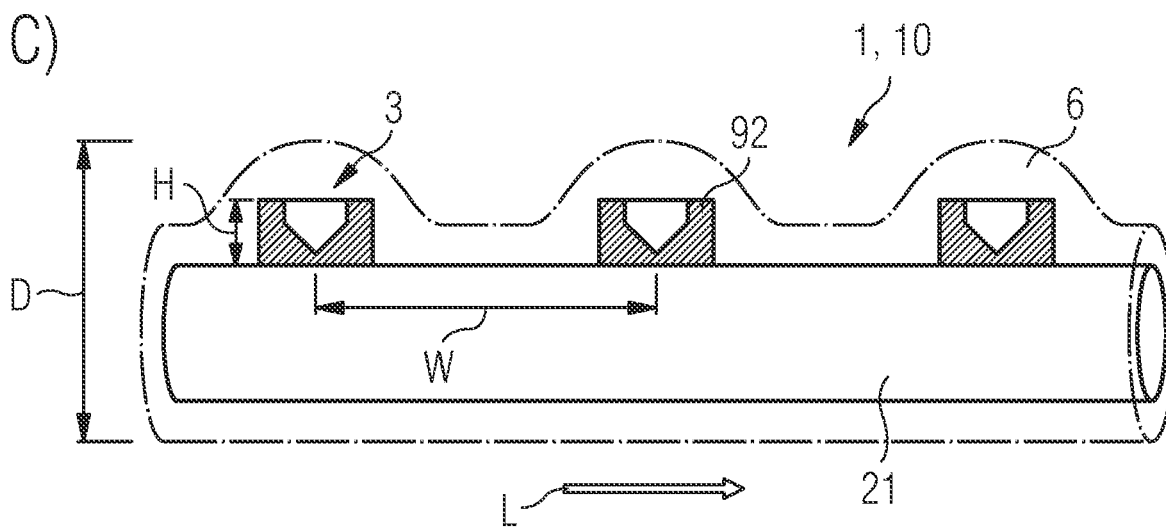

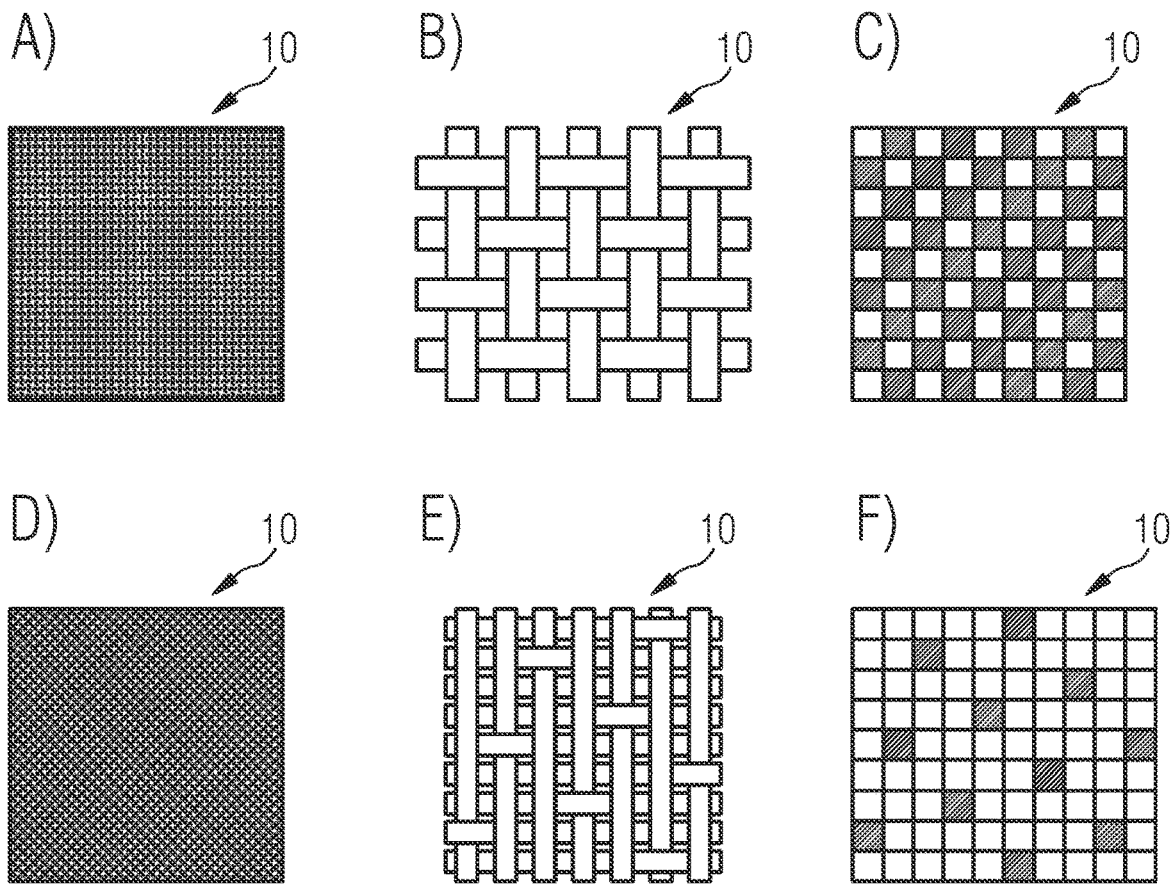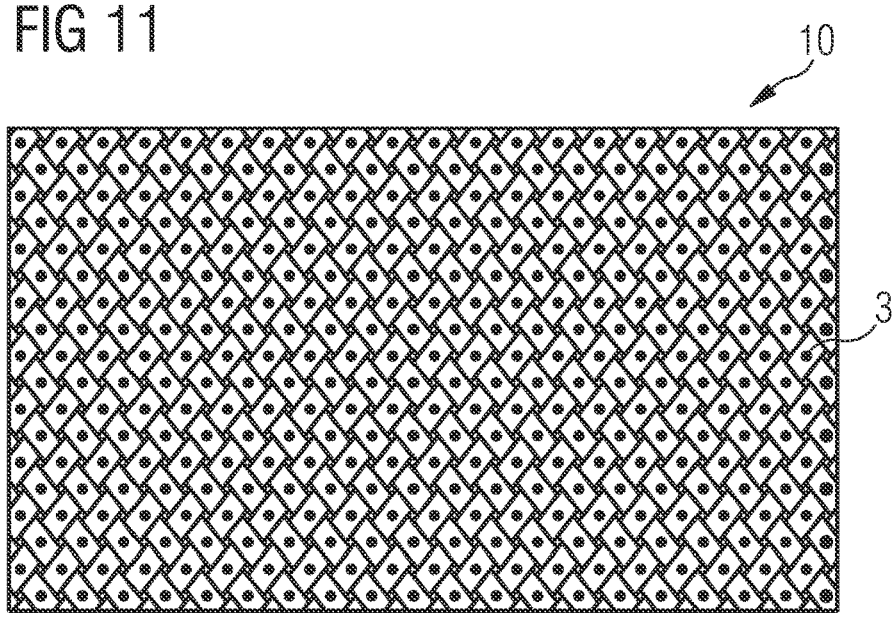

TEXTILE COMPONENT AND METHOD FOR PRODUCING A TEXTILE COMPONENT

CROSS-REFERENCE TO RELATED APPLICATIONS

This application is a U.S. National Stage of International Application No. PCT/EP2018/083188 filed Nov. 30, 2018, which claims priority to German Application No. 10 2017 129 994.7, filed Dec. 14, 2017. The disclosure of which is incorporated herewith by reference.

A textile component is specified. Furthermore, a method for producing a textile component is specified.

An object to be achieved is to specify a textile component into which light-emitting structures are able to be introduced in an efficient manner.

This object is achieved inter alia by means of a textile component having the features of claim 1. The other claims relate to preferred developments.

In accordance with at least one embodiment, the textile component comprises one or a plurality of threads. The at least one thread is flexible and thus bendable. Furthermore, the thread is weavable. That is to say, in particular, that the thread can be processed to form a fabric or in a fabric by way of a standard weaving technique. The textile component can consist of the at least one thread or comprise the thread as part. Furthermore, the textile component can be a part of a textile such as a fabric or a garment or form such a textile.

In particular, the thread is a flexurally slack structure having a dominant one-dimensional extent and a uniformity in the longitudinal direction. The thread can be formed from a single fiber or else be composed of a plurality of fibers. In other words the thread can also be referred to as a yarn, that is to say as a linear textile structure which is comparatively long and thin and is composed of one or a plurality of fibers.

The thread or yarn is, in particular, a textile intermediate product which can be processed to form woven fabrics, knitted fabrics, knitwear and/or embroidery and which can also be used for sewing and for producing twine or ropes. In this respect, the terms yarn and thread are used synonymously in the present case.

In accordance with at least one embodiment, a multiplicity of semiconductor pillars are secured in or on the thread. The semiconductor pillars can be situated in an interior of the thread or be fitted on an exterior of the thread.

In accordance with at least one embodiment, the semiconductor pillars are configured for generating radiation. Preferably, the semiconductor pillars emit near ultraviolet radiation or visible light such as blue light, green light and/or red light during operation. Near ultraviolet means, in particular, a wavelength of maximum emission intensity of at least 360 nm or 390 nm and/or of at most 420 nm or 405 nm.

In accordance with at least one embodiment, a plurality of electrical lines are fitted in or on the thread. The semiconductor pillars are electrically contacted via the electrical lines. The semiconductor pillars on the thread are thus electrically operable.

In accordance with at least one embodiment, an average height of the semiconductor pillars in a transverse, in particular perpendicular, direction with respect to a longitudinal direction of the thread is at most 30% or 20% or 10% or 2% of an average diameter of the thread. In other words, the thread is thick in comparison with the height of the semiconductor pillars.

In at least one embodiment, the textile component comprises at least one flexible, weavable thread. A multiplicity of semiconductor pillars configured for generating radiation are secured in or on the thread. Furthermore, a plurality of electrical lines are situated in or on the thread, the semiconductor pillars being electrically contacted by means of said electrical lines. An average height of the semiconductor pillars in a transverse direction with respect to a longitudinal direction of the thread is at most 20% of an average diameter of the thread.

The stated ratios with regard to the average height and the average diameter can correspondingly apply to one or a plurality of fibers of which the thread is optionally composed. If the thread is composed of a plurality of fibers, then one or a plurality of the fibers of the thread is/are provided with the semiconductor pillars and/or the electrical lines, wherein it is possible for at least one fiber to carry the semiconductor pillars and at least one other fiber to be provided with the lines. In this respect, the following explanations concerning the thread equally apply to fibers as possible components of a corresponding thread.

With the textile component described here and the thread described here, it is possible for light-emitting diodes, LEDs for short, to be brought to application-realistic dimensions for textiles. Conventional LED chips can break in textiles and/or flexible applications on account of the bending stresses and are therefore not used or are used only to a reasonable extent. Customary LEDs are generally unsuitable for textile applications, in particular on account of the geometric dimensions and mechanical properties of the LEDs. In the case of the textile component described here, by contrast, semiconductor pillars are used, also referred to as microrods. The semiconductor pillars integrated in flexible threads can be woven to form planar structures such as fabrics and can be efficiently encapsulated to withstand external environmental influences. For the electrical connection of the semiconductor pillars, transparent electrodes can be used, for example, which can have a low electrical resistance and a high mechanical flexibility.

The textile component described here is, in particular, a transparent, flexible, thread-type medium, for instance composed of plastic or glass, into which the preferably microscopic luminous units in the form of the semiconductor pillars are embedded. Preferably with thin, flexible electrical lines the luminous units are preferably connected in series, operated and/or constructed as flexible display. The lines are composed of silver nanowires for example.

It is thus possible to realize extremely small LED pixels having a spatial extent in the range of the size of the semiconductor pillars in the textile component. The semiconductor pillars have for example a diameter in the range around 1 μm and a height in the range around 1 μm to a few 10 μm. A spatial distance between adjacent pixels or semiconductor pillars can range from a few micrometers to a few millimeters. Group pixels can be constructed; furthermore, RGB pixels grouped in spaced-apart unit cells can be used, for example.

The semiconductor pillars or pixels can be installed in a manner facing upward or downward alternately, also referred to as a flip-flop arrangement. An electrical interconnection can be effected by means of flexible contacts, for example by means of dispensing or printing silver nanowires. A thickness of a flexible thread or display comprising the semiconductor pillars can be comparatively thin. In this regard, a layer thickness in which the semiconductor pillars as active elements are accommodated is preferably a few micrometers. This layer fashioned as a film, for example, can be laminated onto a further carrier film or onto a further thread in order to achieve mechanical reinforcement. Such a carrier film or such a carrier thread has a thickness of 100 μm or more, for example.

The threads can be woven crosswise, with the result that a suitable interconnection with low voltages is possible, in particular with the aid of electrically conductive contact threads for power supply. It is possible to fabricate LED threads by means of a continuous extrusion process, wherein firstly an inner thread is equipped with the semiconductor pillars, then it passes through an extrusion nozzle and is clad in the process.

Introducing the semiconductor pillars into the thread or into the fiber or into a component therefor is effected for example by way of hot embossing. In this case, a raw material for the thread, preferably a thermoplastic material, or a component coated with a thermoplastic material, passes for instance in line form over a growth substrate having the semiconductor pillars, for example a wafer on an xy-table. For embossing purposes, the raw material can briefly stop and be pressed on the hot wafer. As a result, individual or groups of semiconductor pillars are taken up into the raw material and the raw material provided with the semiconductor pillars passes through subsequent process steps. In subsequent process steps, in particular, the lines, for instance in the form of nanowires, for the contacts are embossed and/or applied.

By selectively harvesting the semiconductor pillars from a growth substrate, it is possible that the preferably thermoplastic material can be applied on the thread only at specific distances. Alternatively, predetermined breaking locations can be created on the growth substrate at designated distances.

The thread can be fully encapsulated by means of an extrusion process, for example.

Suitable materials for an embossing process or transfer process are polydimethylsiloxanes, PDMS for short, for example. This example involves a silicon-based polymer. For the purpose of electrical contacting, it is also possible to use two-dimensional graphene nanowires and one-dimensional metal nanowires, also as electrodes for the semiconductor pillars. In addition, wires or metal filaments or metal-coated threads can be interwoven, for example enamel-insulated copper for instance in a weaving direction parallel or perpendicular to the strand having the semiconductor pillars. Crossover points between the threads can constitute electrical connection points.

It is possible for a carrier thread to be metallic and/or specularly reflective, rather than transparent. Transparent polymer transfer structures can be applied on such a thread. Such a thread can serve as a current conducting line.

Consequently, in the process, extremely small LED pixels having dimensions of a few micrometers can be fully encapsulated and processed to be resistant to environmental influences. Mechanical stress as a result of bending is very low on account of the small dimensions of the semiconductor pillars. Very thin, greatly deformable threads can thus be produced. These threads or fibers can be processed further like textile fibers. The combination of the semiconductor pillars based on semiconductor materials with their long lifetime and the possibility of encapsulation in the process and also their high brightness, paired with the high mechanical flexibility of the polymers preferably used, opens up new possibilities for application particularly in the field of wearable electronics and textile electronics.

Corresponding textile components or threads which can emit light can be sewed or woven. Display devices fitted on the skin, such as monitors for health parameters, can thus be created. Furthermore, it is possible to form flexible sensors on robot gripping arms, for instance, or conformal photovoltaic modules. Moreover, it is possible to realize wearable communication devices having, for instance, monitors fitted on the skin, for example physiological fitness trackers, or head-up displays, near-eye displays and video glasses having a curved display field.

In accordance with at least one embodiment, the thread or the at least one fiber with the semiconductor pillars comprises a core material and a cladding layer. The core material and the cladding layer are preferably composed of different materials, but can also be composed of the same material.

In accordance with at least one embodiment, the core material contributes to a tensile strength of the thread to the extent of at least 90% or 95%. In other words, the core material is substantially responsible for the mechanical properties, in particular for its strength. Alternatively, the same can apply, mutatis mutandis, to the cladding layer if the core material is made only in a thin fashion.

In accordance with at least one embodiment, the semiconductor pillars are restricted to the cladding layer. It is possible for the semiconductor pillars not to touch the core material. Consequently, the semiconductor pillars can be arranged on an outer edge of the thread or of the corresponding fiber.

In accordance with at least one embodiment, the electrical lines extend on both sides of the cladding layer. The electrical lines can thus run on a side of the cladding layer facing the core material and on a side of the cladding layer facing away from the core material. Preferably, the electrical lines are at least partly applied directly to the cladding layer.

In accordance with at least one embodiment, the core material is free of the electrical lines. It is thus possible for the core material to be optimized in respect of the mechanical properties of the thread or of the fiber.

In accordance with at least one embodiment, the core material is only partly covered by the electrical lines and/or the cladding layer. By way of example, the cladding layer and/or the electrical lines is/are restricted only to regions along the core material in which the semiconductor pillars are fitted. The core material can thus be exposed regionally and form an outer surface of the thread or of the corresponding fiber. Alternatively, it is possible for the core material to be completely covered by the cladding layer and, consequently, to have no exposed regions.

In accordance with at least one embodiment, the electrical lines run along the longitudinal direction in sections alternately on an inner side, facing the core material, and on an outer side of the cladding layer, facing away from the core material. As a result, it is possible for the semiconductor pillars to be electrically interconnected in series in an efficient manner.

In accordance with at least one embodiment, the semiconductor pillars are introduced directly into the core material of the thread or of the corresponding fiber. It is possible for the semiconductor pillars to terminate flush with the core material or else to project beyond the core material, for example in order to simplify an electrical linking. The semiconductor pillars can touch the core material or there is situated between the semiconductor pillars and the core material an intermediate layer, for example an electrically conductive intermediate layer for electrically contacting the semiconductor pillars or else at least in places an electrically insulating layer for avoiding short circuits. In the last-mentioned case, in particular, the core material can be electrically conductive and be used for electrically contacting the semiconductor pillars. The core material can thus constitute one of the electrical lines or else, in a correspondingly structured fashion, a plurality of the lines.

In accordance with at least one embodiment, the core material contributes to the average diameter of the thread or of the relevant fiber to the extent of at least 70% or 80% or 90% or 95%. In other words, the cladding layer or further components of the thread or of the fiber is/are then thin in comparison with the core material.

Alternatively, the cladding layer is thicker than the core material and contributes to the average diameter of the thread or of the relevant fiber to the extent of at least 70% or 80% or 90% or 95%.

In accordance with at least one embodiment, the semiconductor pillars and/or the electrical lines are covered by at least one light-transmissive protective sheath. The protective sheath is formed by an enamel, for example. Alternatively, the protective sheath can be produced by means of extrusion or printing. Furthermore, it is possible for the protective sheath to be formed by one or more shrink-on sleeves.

The protective sheath can be transparent to radiation generated in the semiconductor pillars during operation. Alternatively, the protective sheath can act as a light guide or as a scattering medium. Moreover, it is possible for the protective sheath to comprise one or more phosphors regionally or in places in order to convert the light generated by the semiconductor pillars partly or completely into light of a longer wavelength. By way of example, white light can be generated by means of a phosphor.

In accordance with at least one embodiment, the semiconductor pillars in or on the thread or in or on the relevant fiber are oriented alternately. That is to say that apices and base points of the semiconductor pillars can point alternately to a center of the thread or of the relevant fiber. Alternatively, the semiconductor pillars on the thread or on the fiber are oriented identically in each case, such that for example all apices or all base points point to the center of the thread or of the fiber.

In accordance with at least one embodiment, the textile component comprises a plurality of the threads with the semiconductor pillars. In this case, the threads are woven in a fabric. Besides the threads with the semiconductor pillars, the fabric additionally comprises a multiplicity of woven threads. The woven threads can be conventional threads without semiconductor pillars. The woven threads can be based on natural materials such as cotton or else on artificial materials such as polyester.

In accordance with at least one embodiment, the textile component comprises at least one electrically conductive contact thread. The contact thread can be composed of an electrically conductive material such as a metal or can comprise a conductive coating on an electrically insulating core, wherein the coating can also be structured to form a plurality of conductor tracks. An electrical linking of the threads to the semiconductor pillars is made possible by way of such a contact thread.

In accordance with at least one embodiment, the contact thread runs transversely with respect to at least one portion of the threads with the semiconductor pillars. At least some of said threads are electrically connected by means of the contact thread. To that end, the relevant threads with the semiconductor pillars can have in places exposed electrical connections or connection areas. Contact threads running parallel to at least one portion of the threads with the semiconductor pillars can also be present.

In accordance with at least one embodiment, at least one portion of the woven threads and/or at least one portion of the threads with the semiconductor pillars are light-transmissive and/or light-guiding. To that end, in particular the woven threads can be composed of a transparent, non-colored material such as polyester. Alternatively, the woven threads or the threads with the semiconductor pillars are fashioned such that they are specularly or diffusely reflective.

In accordance with at least one embodiment, the fabric comprising the threads with the semiconductor pillars has a plurality of meshes. The meshes arise in particular during weaving of the fabric.

In accordance with at least one embodiment, the meshes have an average size and are arranged periodically. A mesh periodicity, corresponding to an average extent of the meshes, is preferably at least 50 μm or 100 μm and/or at most 2 mm or 1 mm or 0.5 mm. It is possible for a uniform mesh periodicity to be present across the entire fabric. Alternatively, the fabric has different regions having deviating mesh periodicities.

In accordance with at least one embodiment, the following holds true for a distance between adjacent semiconductor pillars on the thread or on the fiber along the longitudinal direction: $W=M \times n \pm 0.1$ M. In this case, n is a natural number greater than or equal to 1. Preferably, n is less than or equal to 100 or less than or equal to 10. In other words, a distance between adjacent semiconductor pillars can correspond to a mesh size of the fabric. In this case, the semiconductor pillars are preferably arranged at crossover points between the threads with the semiconductor pillars and the woven threads. Consequently, the semiconductor pillars can be fitted at comparatively thick regions of the fabric with crossing threads.

In accordance with at least one embodiment, an average distance between adjacent semiconductor pillars along the longitudinal direction is equal to at least the average diameter of the thread or double or five times said average diameter. Alternatively or additionally, said distance is at most 1000 times or 100 times the average diameter of the thread. Consequently, the semiconductor pillars can be arranged at comparatively large distances, relative to the average diameter.

In accordance with at least one embodiment, the average diameter of the thread is at least 10 μm or 30 μm or 100 μm. Alternatively or additionally, said average diameter is at most 0.5 mm or 0.3 mm or 0.2 mm.

In accordance with at least one embodiment, the semiconductor pillars have an average height of at least 0.3 μm or 0.5 μm or 1 μm. Alternatively or additionally, said average height is at most 20 μm or 10 μm or 5 μm. An average diameter of the semiconductor pillars is for example at least 0.5 μm or 1 μm and/or at most 10 μm or 5 μm or 2 μm. In particular, the semiconductor pillars are small in relation to the dimensions of the thread or of the corresponding fiber.

In accordance with at least one embodiment, the thread or the corresponding fiber has an extent of at least 0.2 m or 1 m or 25 m or 100 m along the longitudinal direction. In other words, the thread is preferably considerably longer than an average diameter of a growth substrate for the semiconductor pillars.

In accordance with at least one embodiment, the textile component comprises at least one induction coil. The induction coil is configured to energize the semiconductor pillars by means of an alternating electric field generated externally. The induction coil is formed by electrically conductive, in particular metallic, threads, for example, which can be interwoven into the textile component. The induction coil as seen in plan view, can be fashioned as circular or, preferably, hexagonal or rectangular, according to a woven structure of the fabric.

Furthermore, a method for producing a textile component is specified. The textile component is constructed as described in association with one or more of the exemplary embodiments mentioned above. Features of the method are therefore also disclosed for the textile component, and vice versa;

In at least one embodiment, the method comprises the step of providing a growth substrate having the semiconductor pillars. The semiconductor pillars are fitted on the thread or introduced into the thread. On account of the semiconductor pillars being introduced or fitted on the thread, the growth substrate is detached. Furthermore, a process of electrically contacting the semiconductor pillars is carried out.

In accordance with at least one embodiment, the semiconductor pillars still situated on the growth substrate are embossed into a material on the thread or on the fiber. After this embossing, said material is solidified. As a result of said material being removed from the growth substrate, the semiconductor pillars preferably together with said material are detached from the growth substrate. This method step can involve a hot embossing method.

A textile component described here and a method described here are explained in greater detail below on the basis of exemplary embodiments with reference to the drawing. In this case, identical reference signs indicate identical elements in the individual figures. In this case, however, relations to scale are not illustrated; rather, individual elements may be illustrated in an exaggerated size in order to afford a better understanding,

IN THE FIGURES

Figure 4:
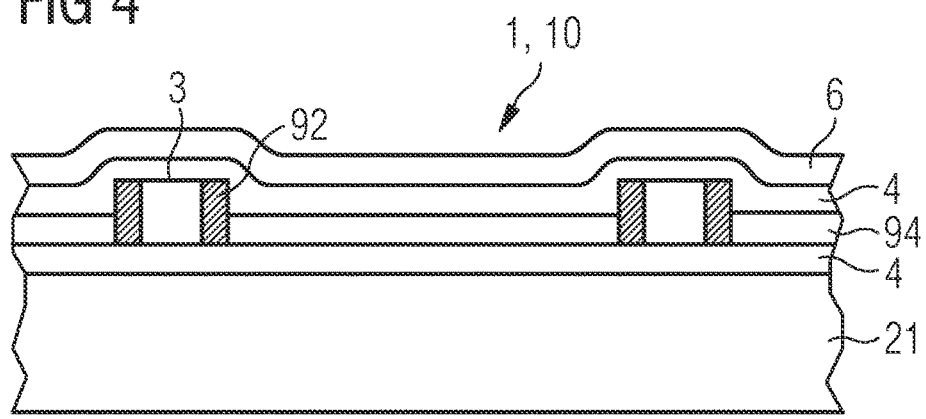
Figure 12:
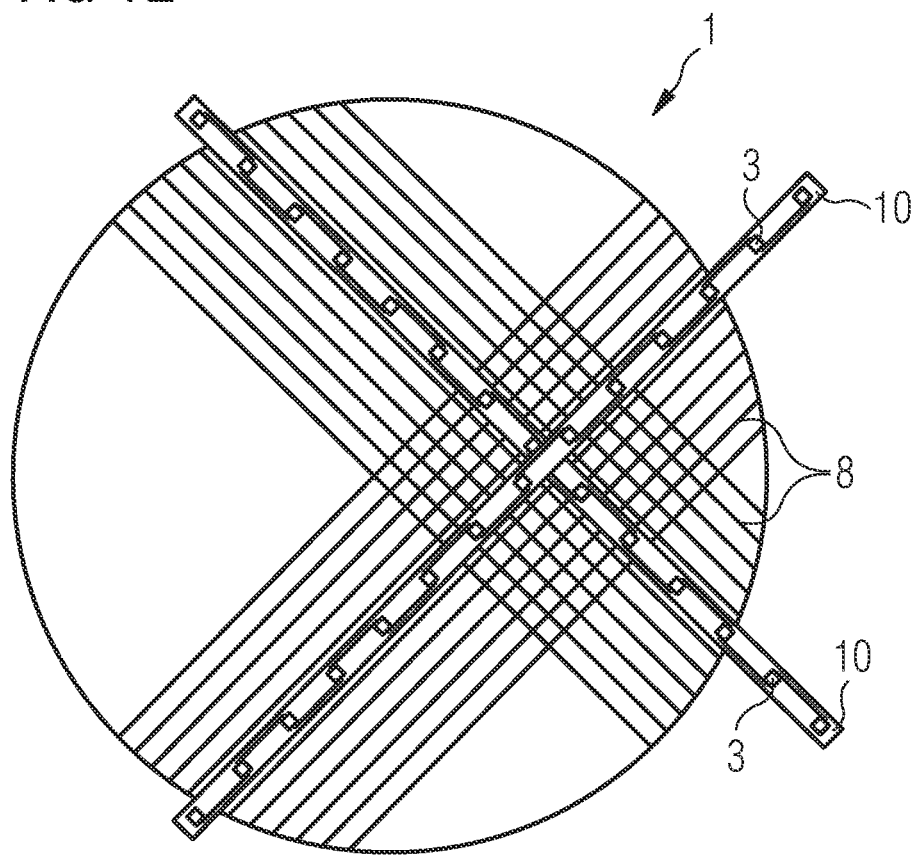
Figure 13:
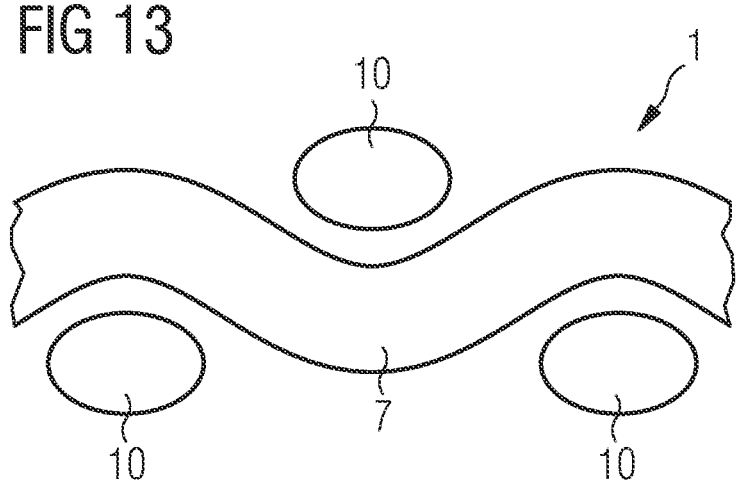
Figure 14:
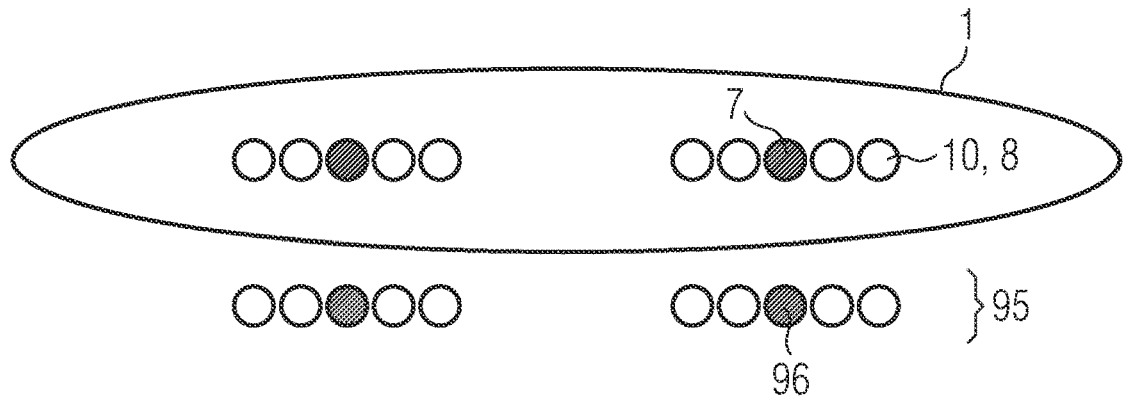
Figure 15:
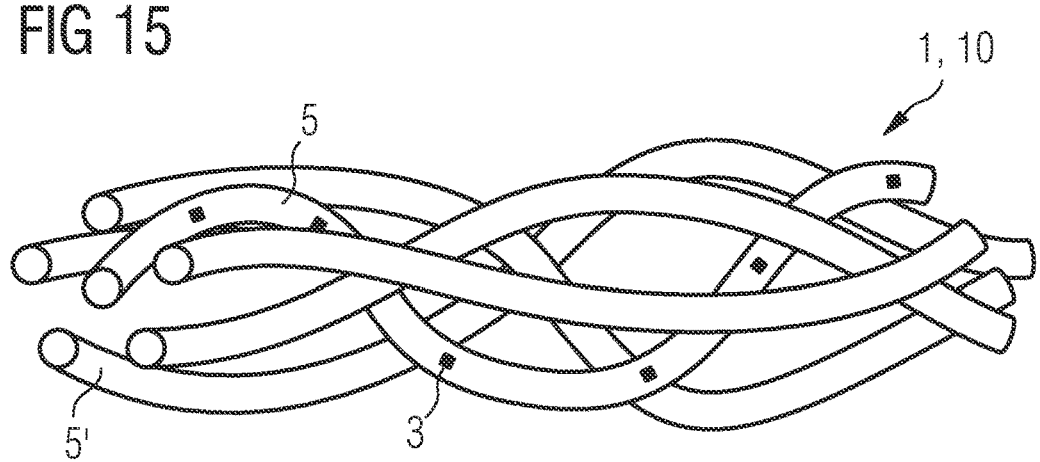
Figure 16:
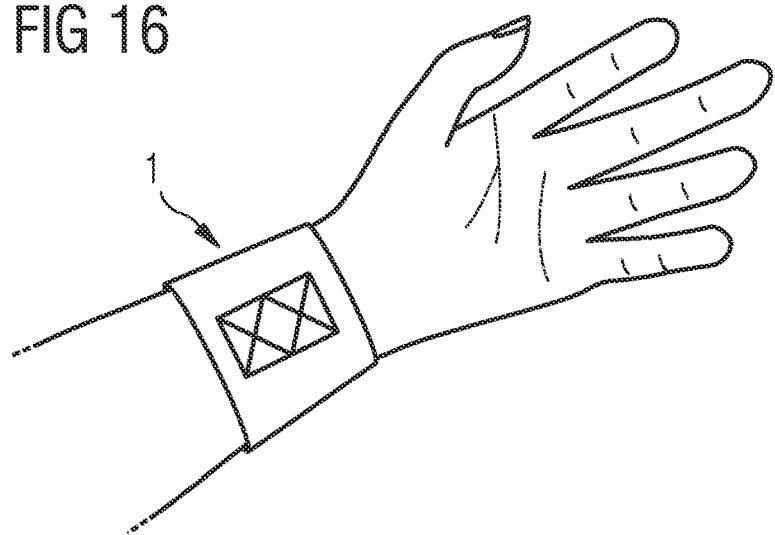

FIGS. 1A to 1F show schematic sectional illustrations of method steps of a method described here for producing exemplary embodiments of textile components, FIGS. 1G and 1H show schematic perspective illustrations of method steps of a method described here, FIGS. 2A to 2C show schematic perspective illustrations of method steps of a method described here, FIG. 3 shows a schematic perspective illustration of one exemplary embodiment of a textile component described here, FIG. 4 shows a schematic sectional illustration of one exemplary embodiment of a textile component described here, FIGS. 5 to 12 show schematic plan views of exemplary embodiments of textile components described here, FIGS. 13 and 14 show schematic sectional illustrations of exemplary embodiments of textile components described here, and FIGS. 15 and 16 show schematic perspective illustrations of exemplary embodiments of textile components described here.

FIG. 1 schematically illustrates a method for producing a textile component 1. In accordance with FIG. 1A, semiconductor pillars 3 are provided on a growth substrate 30. Optionally, a growth layer 37 is situated on the growth substrate 30. The growth layer 37 is preferably partly covered by a mask layer 38.

The semiconductor pillars 3 preferably grow out of openings in the mask layer 38. The semiconductor pillars 3 comprise a semiconductor core 31 followed by an active zone 32, a semiconductor shell 33 and optionally a current distribution layer 34. The layers 32, 33, 34 in each case copy the shape of the semiconductor core 31. Preferably, the semiconductor pillars 3 and thus the layers 31, 32, 33 are based on the material system InGaN and are configured for generating blue light, for instance. The current distribution layer 34 can be formed by a semiconductor material, by a transparent conductive oxide such as ITO or else by a reflective material such as a metal, for example silver. A height H of the semiconductor pillars 3 is in the range of a few micrometers;

a diameter of the semiconductor pillars 3 is approximately 1 µm, for example.

FIG. 1B illustrates that an intermediate carrier 91 is provided. An island-shaped detachment matrix 92 can be situated on the intermediate carrier 91. Some of the semiconductor pillars 3 are embossed into the islands of the detachment matrix 92, in particular by means of hot embossing. After the embossing of the semiconductor pillars 3, the detachment matrix is correspondingly hardened, for instance by reducing the temperature or by photochemical curing. Afterward, the semiconductor pillars 3 remaining in the detachment matrix 92 are detached from the growth substrate 30. This is illustrated in FIG. 1C. This type of detachment can also be referred to as tether lift-off.

The use of an intermediate carrier 91, as illustrated in FIGS. 1B and 1C, is optional.

A connection material 93 can thereupon be molded around the islands of the detachment matrix 92 with the semiconductor pillars 3. The connection material 93 is a thermoplastic material or a silicone, for example. The connection material 93 makes it possible to integrate the semiconductor pillars 3 fixedly into a common body. In accordance with FIG. 1D, here apices 35 of the semiconductor pillars 3 and also base points 36 of the semiconductor pillars 3 point in the same direction in each case.

By contrast, the semiconductor pillars 3 in FIG. 1E are oriented alternately, such that the apices 35 and the base points 36 point upward and downward alternately. Both configurations as depicted in FIGS. 1D and 1E can correspondingly be used in all exemplary embodiments.

It is possible for a respective insulation layer 94 to be situated at the base points 36. The insulation layer 94 can be formed by a material of the mask layer 38 or by a separate material. The insulation layer 94 can terminate flush with the islands of the detachment matrix 92 or be set back relative to the detachment matrix 92 or else project laterally beyond the latter.

On the apices 35 and also on the base points 36, electrical connections 43 are fitted, for example composed of a transparent conductive oxide or at least on one side of the semiconductor pillars 3, composed of a metal that can be fashioned as a mirror for the radiation generated during operation. By way of the connections 43, the semiconductor pillars 3 are electrically contactable directly.

Optionally, a respective energization layer 39 is situated on the semiconductor pillars 3, in particular on the semiconductor shell 33 or on the current distribution layer 34. The energization layer 39 is composed of a transparent conductive oxide or composed of a metal. It is possible for the energization layer 39 on the apices 35 to be electrically connected in each case to the associated connections 43. The energization layer 39, like the layers 31, 32, 33, 34, as well, can project into the insulation layer 94 or extend as far as the insulation layer 94.

FIG. 1F illustrates that electrical lines 4 are fitted on the connection material 93 and also on the connections 43. A series connection of the semiconductor pillars 3 can be obtained by way of the electrical lines 4. If the configuration from FIG. 1D is used, the semiconductor pillars 3 can also be electrically connected in parallel. Mixed forms comprising a parallel connection and a series connection are likewise possible. The electrical lines 4 are formed by silver nanowires, for example, which can be applied by printing.

In accordance with FIG. 1F, the lines 4 run alternately on an underside and on a top side of the connection material 93. In this case, the connection material 93 can be fashioned in the shape of a plate. Alternatively, the connection material 93 can run in an elongated manner and already be fashioned in the shape of a fiber or in the shape of a thread, see FIG. 1G. In accordance with FIG. 1G, the connection material 93 has a circular or round cross section.

If the connection material 93 is fashioned in the shape of a plate, as indicated in FIG. 1F, for instance, it is possible to extract narrow strips from the connection material 93, thus giving rise to fiberlike or threadlike structures, for example having a square or rectangular cross section, different than the round cross section in FIG. 1G. Independently of the cross-sectional shape of a corresponding core material 91, formed by the connection material 93, the further processing can be carried out in the same way in each case.

The method step in FIG. 1H illustrates that a cladding layer 22 is produced around the connection material 93. To that end, the connection material 93 is guided through an extrusion nozzle, for example, in which the cladding layer 22 is produced around the core material 21.

The core material 21 has a diameter substantially the same as the height of the semiconductor pillars 3. An average diameter D of the thread 10 produced, composed of the core material 21 and the cladding layer 22, is preferably significantly greater than the height H of the semiconductor pillars 3. In this case, a mechanical stabilization of the thread 10 is primarily provided by the cladding layer 22.

The semiconductor pillars 3 can be at a comparatively large distance W from one another along a longitudinal direction L of the thread 10. The distance W can be in the range of a plurality of millimeters. The average diameter D of the thread is preferably between 0.1 mm and 1 mm inclusive. By contrast, the diameter of the core material 21 can be at least 10 μm and/or at most 1 mm.

The method step in FIG. 2A illustrates that the detachment matrix 92 in the form of islands is fitted on the core material 21. The detachment matrix 92 preferably only partly covers the semiconductor core 21, for example along a line running straight parallel to the longitudinal direction L. The core material 21 is very large in comparison with a thickness of the detachment matrix 22. In this configuration, a diameter of the core material 21 can exceed a thickness of the detachment matrix 92 by a factor of 10 or 20 or 100, for example. The core material 21 is composed of a plastic or is composed of a glass, for example.

FIG. 2B illustrates that the semiconductor pillars 3 are transferred into the detachment matrix 92 analogously to FIGS. 1B and 1C, proceeding from a growth substrate, not depicted in FIG. 2.

A protective sheath 6 can subsequently be produced. The protective sheath 6 is light-transmissive. Optionally, the protective sheath 6 can contain an optically effective material such as scattering particles and/or at least one phosphor. The semiconductor pillars 3 and also electrical lines, not depicted in FIG. 2, are sealed by way of the protective sheath 6. With the fitting of the protective sheath 6, the thread 10 arises, which forms the textile component 1.

In a departure from the illustration in FIG. 2C, it is possible that the protective sheath 6 is applied to the core material 21 only in the region of the detachment matrix 92 and, accordingly, the core material 21 is then not completely sheathed.

In the variant of the production method as elucidated in FIG. 3, the semiconductor pillars 3 are pressed directly into the core material 21 and then the protective sheath 6 or alternatively the cladding layer is produced.

The exemplary embodiment in FIG. 4 illustrates that one of the electrical lines 4 is applied on the core material 21. The line 4 on the core material 21 is realized by a metal coating of the core material 21, for example. The semiconductor pillars 3, optionally in the detachment matrix 92, are situated on the line 4. Afterward an insulation layer 94 is present, followed by a further electrical line 4 and optionally the protective sheath 6. Various electrical interconnections of the semiconductor pillars 3 can be realized by way of such lines 4 in combination with an insulation layer 94 and the protective sheath 6. The same correspondingly applies in all the other exemplary embodiments.

FIGS. 5 to 12 illustrate in each case that the threads 10 with the semiconductor pillars 3 together with woven threads 8 form a fabric, which is simultaneously the textile component 1. Various woven patterns can be used here.

Figure 5:
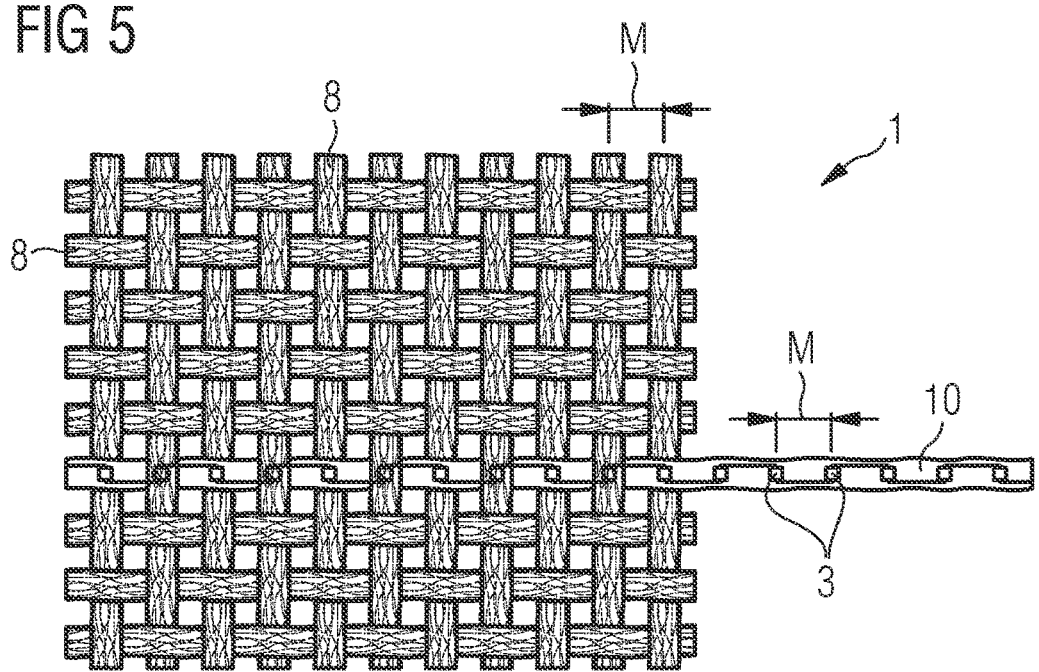

In accordance with FIG. 5, a distance between the semiconductor pillars 3 along the thread 10 is equal to a mesh periodicity M of the woven fabric composed of the woven threads 8, for example. The semiconductor pillars 3 can thus become located in each case on crossover points between the threads 10, 8.

Figure 6:
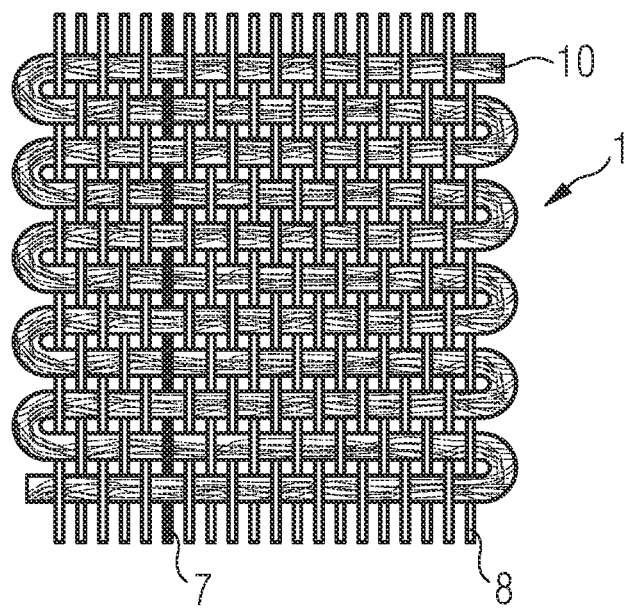
Figure 7:
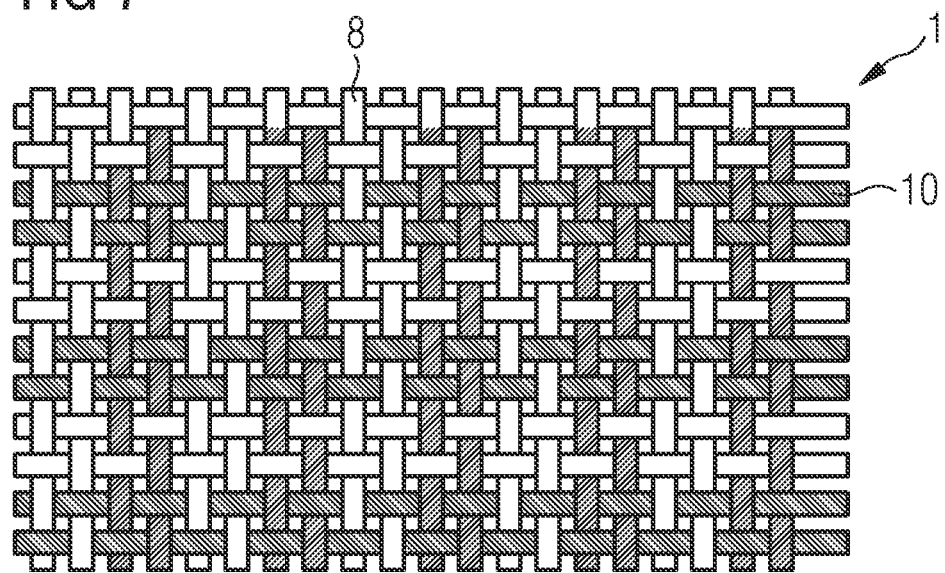
Figure 8:
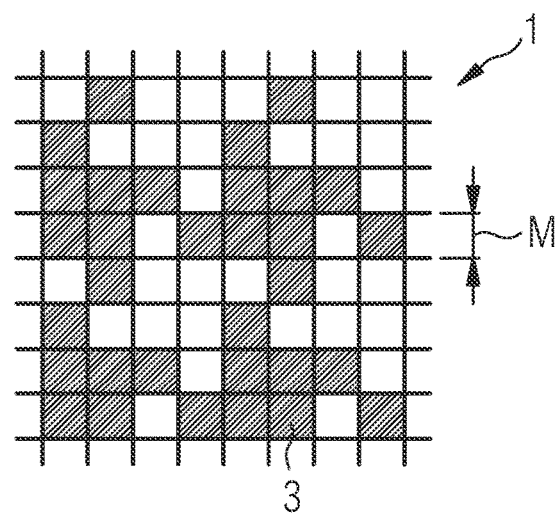
Figure 9:
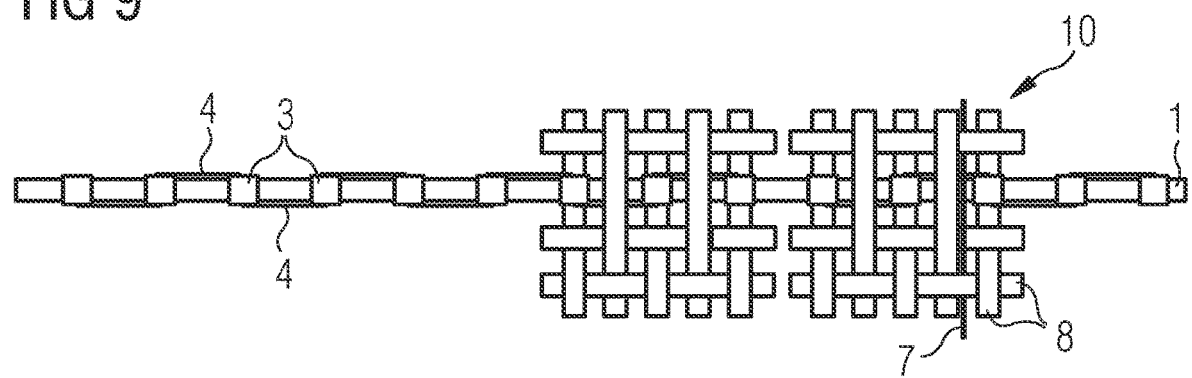

FIG. 6 shows that the thread 10 with the semiconductor pillars 3 is guided across the woven fabric 1 in a serpentine fashion. Longitudinal threads are predominantly formed by the woven threads 8. For the purpose of electrical contacting, at least one contact thread 7, for example a metal thread, can also be present. What is achievable by means of the contact thread 7 is that the lines 4 along the thread 10 with the semiconductor pillars 3 need have only a comparatively low electrical conductivity since it is not necessary for relatively large distances to be coped with by means of the lines 4 themselves. For this purpose, the contact thread 7 can have a comparatively high electrical conductivity.

Various possible woven patterns, which can correspondingly be used in all the exemplary embodiments, may be found in figures 5 to 12. The threads 10, 8 and optionally also the contact threads 7 can be interwoven in different patterns. The patterns differ for example in the number of longitudinal threads spanned by a transverse thread. The individual patterns can run vertically and horizontally or else along 45° diagonals. Thus, see FIG. 11, for instance, complex patterns and point arrangements of the semiconductor pillars 3 can be realized; see likewise FIG. 8.

FIG. 12 especially illustrates that the threads 10 with the semiconductor pillars 3 can cross one another and run diagonally along two 45° directions, for example. It is possible, in contrast to the illustration in FIG. 12, for additional threads running vertically and/or horizontally to be present in the textile component 1.

FIG. 13 illustrates schematically that the threads 10 with the semiconductor pillars 3 can be arranged on both sides of a contact thread 12 in order to form the textile component 1.

For supplying the textile component 1 with energy it is possible for a secondary coil to be formed by way of the contact threads 7. An external primary coil 95 can generate, by means of wire 96, an alternating electric field that supplies enough current for operating the textile component 1, such that the semiconductor pillars 3 emit light. This is illustrated in FIG. 14.

Alternatively, the threads 10 with the semiconductor pillars 3 can be connected to an energy source such as a battery.

FIG. 15 schematically illustrates that the thread 10 is composed of a plurality of fibers 5. One of the fibers 5 has the semiconductor pillars 3. Corresponding fibers 5 can be produced analogously to FIGS. 1 to 3. In a departure from the illustration in FIG. 15, it is also possible for a plurality of the fibers 5 of the thread 10 to be provided with the semiconductor pillars 3.

FIG. 16 schematically illustrates that a textile component 1 can be worn as a wristband on a wrist, for example, and that the semiconductor pillars 3 can form a display for displaying information.

Corresponding textile components 1 which are self-luminous can also find application in the area of safety, for instance for safety clothing.

Unless indicated otherwise, the components shown in the figures succeed one another directly preferably in the order specified. Layers not touching one another in the figures are preferably spaced apart from one another. Insofar as lines are drawn parallel to one another, the corresponding areas are preferably likewise oriented parallel to one another.

Likewise, unless indicated otherwise, the relative positions of the depicted components with respect to one another are rendered correctly in the figures.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 10 2017 129 994.7, the disclosure content of which is hereby incorporated by reference.

LIST OF REFERENCE SIGNS

1 Textile component
10 Thread
21 Core material
22 Cladding layer
3 Semiconductor pillar
30 Growth substrate
31 Semiconductor core
32 Active zone
33 Semiconductor shell
34 Current distribution layer
35 Apex
36 Base point
37 Growth layer
38 Mask layer
4 Electrical line
43 Electrical connection
5 Fiber
6 Light-transmissive protective sheath
7 Contact thread
8 Woven thread
91 Intermediate carrier
92 Detachment matrix
93 Connection material
94 Insulation layer
95 Primary coil
96 Wire
D Average diameter of the thread
H Average height of the semiconductor pillars
L Longitudinal direction of the thread
M Mesh periodicity
W Distance between the semiconductor pillars along the longitudinal direction

The invention claimed is:

1. A textile component comprising at least one flexible, weavable thread, wherein
   a multiplicity of semiconductor pillars are secured in or on the thread,
   the semiconductor pillars are configured for generating radiation,
   a plurality of electrical lines are fitted in or on the thread,
   the semiconductor pillars are electrically contacted by means of the electrical lines, and
   an average height of the semiconductor pillars in a transverse direction with respect to a longitudinal direction of the thread is at most 20% of an average diameter of the thread,
   the thread comprises a core material and a cladding layer, the semiconductor pillars are either restricted to the cladding layer or introduced directly into the core material,
   the semiconductor pillars in or on the thread or in at least one fiber with the semiconductor pillars are oriented alternately, such that apices and base points of the semiconductor pillars alternately point toward a center of the thread or of a relevant fiber, and
   the plurality of electrical lines include respective electrical line sections that run along the longitudinal direction and connect, on alternating sides of the thread, an apex and a base point of adjacent semiconductor pillars.

2. The textile component as claimed in claim 1,
   in which the thread is composed of a plurality of fibers, wherein at least one of the fibers is provided with the semiconductor pillars and the electrical lines.

3. The textile component as claimed in claim 1, in which the semiconductor pillars are restricted to the cladding layer, and wherein the core material is responsible for at least 90% of a tensile strength of the thread.

4. The textile component as claimed in claim 3,
   in which the electrical lines extend on both sides of the cladding layer and the core material is free of the electrical lines.

5. The textile component as claimed in claim 3,
   in which the core material is only partly covered by the electrical lines and the cladding layer.

6. The textile component as claimed in claim 3,
   in which the respective electrical line sections are positioned on opposing sides of the thread alternately on an inner side of the cladding layer, facing the core material, and on an outer side of the cladding layer, facing away from the core material, such that the semiconductor pillars are electrically interconnected in series.

7. The textile component as claimed in claim 2,
   in which the semiconductor pillars are introduced directly into the core material of the thread or into the core material of the at least one relevant fiber,
   wherein the core material contributes to the average diameter of the thread or of the relevant fiber to the extent of at least 80%.

8. The textile component as claimed in claim 1, in which the semiconductor pillars and also conductor tracks are covered by a light-transmissive protective sheath.

9. The textile component as claimed in claim 1, comprising a plurality of the threads with the semiconductor pillars, wherein the threads are woven in a fabric and the fabric additionally comprises a multiplicity of woven threads.

10. The textile component as claimed in claim 9,
furthermore comprising at least one electrically conductive contact thread,
wherein the contact thread runs transversely with respect to at least one portion of the threads with the semiconductor pillars, and at least some of said threads are electrically connected by means of the contact thread.

11. The textile component as claimed in claim 9,
in which at least one portion of the woven threads and/or at least one portion of the threads with the semiconductor pillars are light-transmissive and light-guiding.

12. The textile component as claimed in claim 9,
in which the fabric has a mesh periodicity M of between 50 µm and 2 mm inclusive and the following holds true in each case for a distance between adjacent semiconductor pillars along the longitudinal direction: $W=M \times n \pm 0.1$ M where $n \in \mathbb{N}$.

13. The textile component as claimed in claim 1,
in which an average distance between adjacent semiconductor pillars along the longitudinal direction is at least double the average diameter of the thread,
wherein the average diameter of the thread is at least 30 µm and at most 300 µm, the average height (H) of the semiconductor pillars is between 0.5 µm and 5 µm inclusive and the thread extends along the longitudinal direction at least 25 m.

14. The textile component as claimed in claim 1,
furthermore comprising at least one induction coil,
wherein the induction coil is configured to energize the semiconductor pillars by means of an alternating electrical field generated externally.

15. A method for producing a textile component as claimed in claim 2, comprising:
Providing a growth substrate having the semiconductor pillars,
Fitting or introducing the semiconductor pillars on the thread or on the fiber and detaching from the growth substrate, and
Electrically contacting the semiconductor pillars.

16. The method as claimed in the claim 15,
in which the semiconductor pillars still situated on the growth substrate are embossed into a material on the thread or on the fiber, whereupon said material is solidified and, by means of said material being removed from the growth substrate, the semiconductor pillars are detached together with said material from the growth substrate.

* * * * *